(12) United States Patent
Kawanago et al.

(10) Patent No.: US 11,616,104 B2
(45) Date of Patent: Mar. 28, 2023

(54) DISPLAY DEVICE AND METHOD FOR PRODUCING SAME

(71) Applicant: Japan Display Inc., Tokyo (JP)

(72) Inventors: Hiroshi Kawanago, Tokyo (JP); Kazufumi Watabe, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 197 days.

(21) Appl. No.: 16/910,084

(22) Filed: Jun. 24, 2020

(65) Prior Publication Data

US 2020/0328262 A1    Oct. 15, 2020

Related U.S. Application Data

(63) Continuation of application No. PCT/JP2018/031124, filed on Aug. 23, 2018.

(30) Foreign Application Priority Data

Dec. 27, 2017   (JP) .............................. JP2017-251073

(51) Int. Cl.
   *H01L 51/52*      (2006.01)
   *H01L 27/32*      (2006.01)
   (Continued)

(52) U.S. Cl.
   CPC .......... *H01L 27/3241* (2013.01); *B32B 15/08* (2013.01); *H01L 51/0002* (2013.01); *H01L 51/0097* (2013.01); *H01L 51/5256* (2013.01)

(58) Field of Classification Search
   None
   See application file for complete search history.

(56) References Cited

U.S. PATENT DOCUMENTS

2015/0102324 A1*  4/2015  Lee ..................... H01L 51/0097
                                                         257/40
2016/0062520 A1*  3/2016  Choi ..................... G06F 3/047
                                                         345/174
(Continued)

FOREIGN PATENT DOCUMENTS

JP      2010-054543 A    3/2010
JP      2013-127905 A    6/2013

OTHER PUBLICATIONS

International Search Report and Written Opinion dated Nov. 6, 2018 for PCT/JP2018/031124 filed Aug. 23, 2018, 11 pages including English Translation of the International Search Report.

*Primary Examiner* — Benjamin P Sandvik
(74) *Attorney, Agent, or Firm* — Xsensus LLP

(57) ABSTRACT

The purpose of the invention is to manufacture the flexible display device having resin substrate with high yield. The structure is as follows.
A manufacturing method of a display device comprising:
   forming a first layer of a semiconductor on a glass substrate,
   forming a second layer of a first metal on the first layer,
   forming a third layer of a first insulating material on the second layer,
   forming a fourth layer of a second metal or a metal oxide on the third layer,
   coating precursor of polyimide on the fourth layer,
   making a polyimide substrate by baking the precursor of polyimide to make a polyimide substrate,
   forming pixels on the polyimide substrate,
   separating the polyimide substrate and the glass substrate by making peel off between the second layer and the third layer with irradiation of a laser beam on the first layer.

11 Claims, 21 Drawing Sheets

(51) Int. Cl.
    *B32B 15/08*     (2006.01)
    *H01L 51/00*     (2006.01)

(56) References Cited

U.S. PATENT DOCUMENTS

| | | | |
|---|---|---|---|
| 2016/0141551 A1* | 5/2016 | Seo | H01L 51/0097 |
| | | | 257/40 |
| 2017/0338291 A1* | 11/2017 | Ishii | G02F 1/133305 |
| 2017/0338429 A1* | 11/2017 | Watabe | H01L 51/5271 |
| 2017/0338433 A1* | 11/2017 | Ishii | G02F 1/136 |

\* cited by examiner

FIG. 32

| MATERIAL | MELTING TEMPERATURE (°C) | COEFFICIENT OF THERMAL EXPANSION (10⁻⁶/K) | COEFFICIENT OF THERMAL CONDUCTIVITY (W/mK) |
|---|---|---|---|
| Ti | 1668 | 6.3 | 22 |
| Cr | 1907 | 4.9 | 96.5 |
| Al2O3 | 2072 | 7.2 | 30 |
| SiO2 | 1650 | 0.5 | 1.5 |
| Al | 660 | 23.1 | 236 |
| Si | 1414 | 2.6 | 157 |

DISPLAY DEVICE AND METHOD FOR PRODUCING SAME

CLAIM OF PRIORITY

The present application is a continuation application of International Application No. PCT/JP2018/031124, filed on Aug. 23, 2018, which claims priority to Japanese Patent Application No. 2017-251073, filed on Dec. 27, 2017, the contents of these applications are incorporated herein by reference in their entirety.

BACKGROUND OF THE INVENTION

(1) Field of the Invention

The present invention relates to the display devices, specifically the flexible display devices that the substrates can be curved, and manufacturing method for those display devices.

(2) Description of the Related Art

The organic EL display device and the liquid crystal display device can be used in curved state by making those devices thin. Further, those display devices can be made flexible by making the substrates by resin, e.g. polyimide.

Many layers as conductive layers, insulating layers, protective layers, electrode layers and so forth are formed on the resin substrate. Light transmittance becomes a problem when many layers are formed. Patent document 1 discloses NDF (Neutral Density Filter), which the metal layer and the dielectric layer are laminated alternatively. Even a metal layer, the transmittance of the visible light can be increased when the layer is made thin. Patent document 2 discloses a change of transmittances of light when aluminum (Al) film is made thin.

PRIOR TECHNICAL DOCUMENT

Patent Document

Patent document 1: Japanese patent application laid open No. 2010-54543
Patent document 2: Japanese patent application laid open No. 2013-127905

SUMMARY OF THE INVENTION

A thickness of the resin substrate used in the flexible display device is 10 to 20 microns. Such a thin substrate is formed as that e.g. liquid resin is coated on a glass substrate, then it is baked to become a thin resin substrate. The resin substrate passes through the manufacturing process with the glass substrate until the display panel is completed; after that, the glass substrate is removed from the resin substrate, then, the flexible display device is realized.

Such a process has following problems. Firstly, the resin substrate must securely be adhered to the glass substrate during the manufacturing process. Secondly, after the display device is completed, the glass substrate must be removed securely form the resin substrate.

In general, however, the adhesive strength between the resin and the glass substrate is weak. In addition, even the resin substrate and the glass substrate can adhere strongly to each other, it is not always possible to remove the glass substrate from the resin substrate after the display device is completed.

The purpose of the present invention is to realize the structure of the display device that: the adhesive strength between the resin substrate and the glass substrate is strong enough during the manufacturing process; however, once the display device is completed, the glass substrate is securely removed from the resin substrate.

The present invention overcomes the above explained problem; the concrete structures are as follows.

A display device having plural pixels on a resin substrate comprising:
  a first layer made of a metal or a metal oxide and formed on the resin substrate, the resin substrate being between the first layer and pixels;
  a second layer made of a first insulating material and in contact with the first layer, the first layer being between the resin substrate and the second layer;
  a third layer made of a second insulating material and in contact with the second layer, the second layer being between the first layer and the third layer; and
  a fourth layer made of a third insulating material and in contact with the third layer, the third layer being between the second layer and the fourth layer.

The display device according to the above structure, the first layer can be thinner than the fourth layer.

A manufacturing method of a display device comprising:
  forming a first layer of a semiconductor on a glass substrate,
  forming a second layer of a first metal on the first layer,
  forming a third layer of a first insulating material on the second layer,
  forming a fourth layer of a second metal or a metal oxide on the third layer,
  coating precursor of polyimide on the fourth layer,
  making a polyimide substrate by baking the precursor of polyimide to make a polyimide substrate,
  forming pixels on the polyimide substrate, and
  separating the polyimide substrate and the glass substrate by making peel off between the second layer and the third layer with irradiation of a laser beam on the first layer.

A manufacturing method of a display device comprising:
  forming a first layer of a semiconductor on a glass substrate,
  forming a second layer of a first metal on the first layer,
  forming a third layer of a first insulating material on the second layer,
  forming a fourth layer of a second insulating material on the third layer,
  forming a fifth layer of a third insulating material on the fourth layer,
  forming a sixth layer of a second metal or a metal oxide on the fifth layer,
  coating precursor of polyimide on the fourth layer,
  making a polyimide substrate by baking the precursor of polyimide to make a polyimide substrate,
  forming pixels on the polyimide substrate, and
  separating the polyimide substrate and the glass substrate by making peel off between the second layer and the third layer with irradiation of a laser beam on the first layer.

BRIEF DESCRIPTION OF THE DRAWINGS

FIG. 32 is a table that summarizes heat characteristics of metals and insulating materials, which can be used in the present invention.

DETAILED DESCRIPTION OF THE PREFERRED EMBODIMENTS

The present invention is explained by the following embodiments.

Embodiment 1

Figure 1:
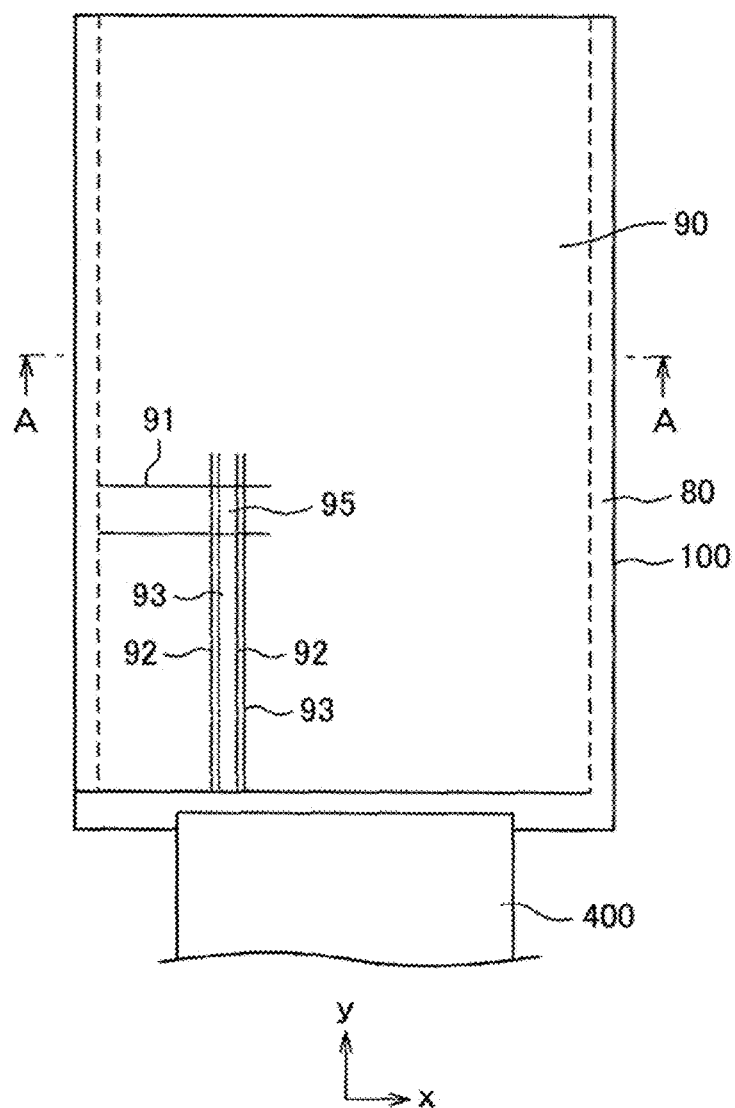
FIG. 1 is a plan view of the organic EL display device.

FIG. 1 is a plan view of the organic EL display device, which the present invention is applied. The organic EL display device according to the present invention is the display device that can be curved flexibly. The TFT substrate 100 is made of resin, on which the TFTs (Thin Film Transistor), scan lines, power lines, video signal lines, pixel electrodes, organic EL layers and forth are formed.

In FIG. 1, the scan line driving circuits 80 are formed at both sides of the display area 90. In the display area 90, the scan lines 91 extend in lateral direction (x direction) and arranged in longitudinal direction (y direction). The video signal lines 92 and the power lines 93 extend in the longitudinal direction and arranged in lateral direction. The pixel 95 is defined by area surrounded by scan lines 91 and the video signal lines 92 or the power lines 93. In the pixel 95, the driving transistor, the switching transistor, (each of them are formed by TFT), the organic EL layer that emits light, and so on are formed.

Figure 2:
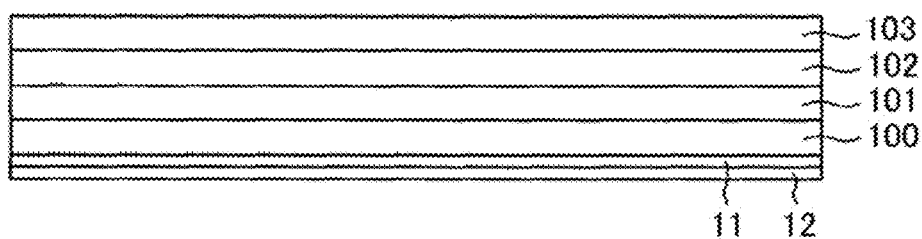
FIG. 2 is a cross sectional view along the line A-A of FIG. 1 according to the present invention.

FIG. 2 is a cross sectional view along the line A-A of FIG. 1. In FIG. 2, the TFT substrate 100 is made of resin. Among resins, polyimide has an excellent characteristics for the substrate of the display device because of its heat resistance, mechanical strength and so on. Therefore, the polyimide is premised to be used for the TFT substrate 100 herein after; however, the present invention is applicable when the TFT substrate 100 is made of other resins. A thickness of the TFT substrate 100 is e.g. 10 to 20 microns.

The TFT wiring layer 101 is formed on the TFT substrate 100. The TFT wiring layer 101 includes: scan lines, video signal lines, power lines, organic EL layers, which emit light, anodes, which work as pixel electrodes, cathodes, which work as the common electrodes, and so forth. The protective layer 102 is formed covering the TFT wiring layer 101. The characteristics of the organic EL layer are deteriorated by moisture and so forth; the protective layer 102 suppresses intrusion of moisture from the outside, and also mechanically protects the organic EL layer.

The circular polarizer 103 is disposed on the protective layer 102. The TFT wiring layer 101 has reflection electrodes, which reflect external light. The circular polarizer 103 prevents the reflection of external light; consequently, visibility of the screen is improved.

In FIG. 2, the adhesive layer 11 made of metal and the non-thermal expansion layer 12, which is made of low thermal expansion material like e.g. SiO, are formed under the TFT substrate 100. The existence of those layers characterizes the present invention.

Figure 3:
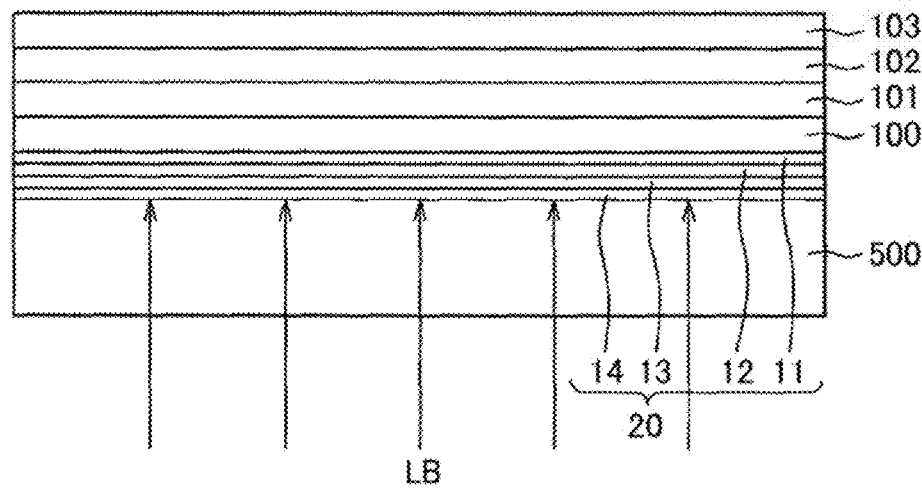
FIG. 3 is a cross sectional view that the glass substrate is being separated from the TFT substrate according to the present invention.

FIG. 3 is a cross sectional view that show an interim structure in the manufacturing process for the structure of FIG. 2. In FIG. 3, the TFT substrate 100 is formed by polyimide on the glass substrate 500; however, in the present invention, the multilayer film 20 is formed on the glass substrate before the TFT substrate 100 is formed. The multilayer film 20 is constituted by, in order from the glass substrate 500, the photo heat conversion layer 14, the thermal expansion layer 13, non-thermal expansion layer 12, and adhesive layer 11. Those layers are explained in FIG. 4.

In FIG. 3, the polyimide substrate 100 is formed on the multilayer film 20. The polyimide substrate 100 is formed as that: the polyamic acid, which is precursor of polyimide, is coated by e.g. slit coater, and is baked. The TFT wiring layer 101, which constitutes the essential portion of the organic EL display device, is formed on the polyimide substrate 100. The structure of the TFT wiring layer 101 is the same as explained in FIG. 2. After that, the protective layer 102 is formed and, then, the circular polarizer 103 is adhered.

As shown in FIG. 3, several elements are formed on the glass substrate 500 in the manufacturing process of the flexible display device. A thickness of the glass substrate 500 is 0.5 mm or 0.7 mm, which are easily procured in the market. However, the glass substrate 500 needs to be removed after the flexible display device is completed. In FIG. 3, the laser beam (LB) is irradiated to the multilayer film 20, especially, the photo heat conversion layer 14. The TFT substrate 100 and the glass substrate 500 are separated by separating the thermal expansion layer 13 and non-thermal expansion layer 12 in the multilayer film 20.

This mechanism is explained in detail in FIGS. 4 to 9. By the way, in manufacturing organic EL display device or the liquid crystal display device, it is not efficient to make a single display device individually, thus, many display panels are formed in the mother substrate and then, separated to an individual display device. Herein after, even the explanation is made for an individual display panel, it is the same to the mother substrate.

Figure 4:
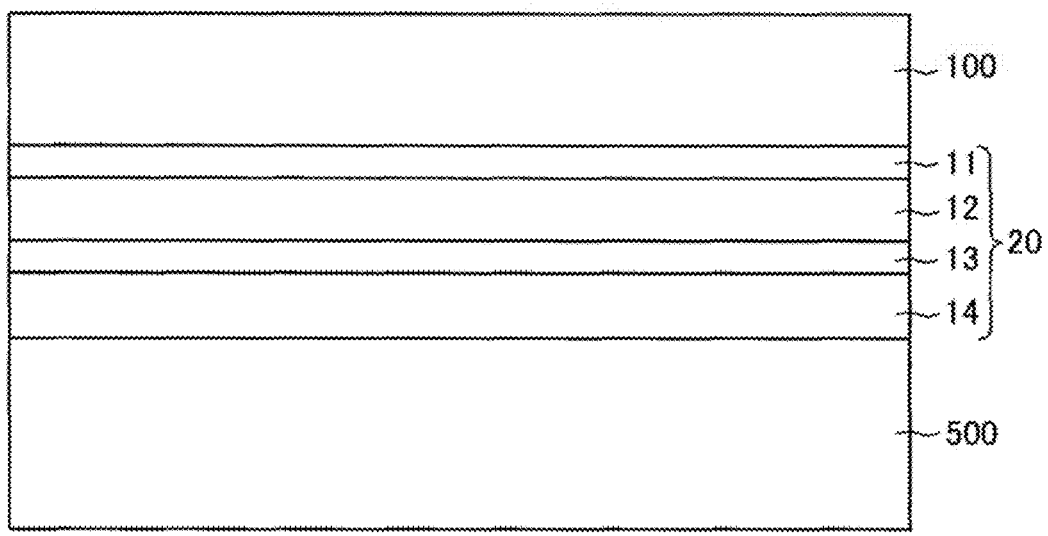
FIG. 4 is a cross sectional view before the TFT substrate and the glass substrate are separated according to the present invention.

FIG. 4 is a cross sectional view of the multilayer film 20 and the TFT substrate 100. FIGS. 4 to 9, the layers on the TFT substrate 100, e.g. TFT wiring layer 101 and so forth, are omitted. In FIG. 4, the amorphous silicon (a-Si) film is formed as the photo heat conversion layer 14 in a thickness of 50 nm on the glass substrate 500. A preferable thickness of the a-Si film 14 is 40 to 80 nm. The a-Si film 14 is formed by CVD (Chemical Vapor Deposition). The role of the a-Si film 14 is to convert the laser beam to heat when the laser beam is irradiated from the side of the glass substrate 500.

The Al (Aluminum) layer, for example, as the thermal expansion layer 13, is formed by sputtering in a thickness of 10 nm on the photo heat conversion layer 14. The role of the thermal expansion layer 13, which expands by taking the heat from the photo heat conversion layer 14, is to generate stress between the non-thermal expansion layer 12. Thus, a thickness of the thermal expansion layer 13 needs to be thick enough to generate the stress between the non-thermal expansion layer 12, and thus, it needs to be 5 nm or more. On the other hand, the thermal expansion layer 13 needs to be heated up to high enough temperature by taking the heat from the photo heat conversion layer 14; thus, the thickness of the thermal expansion layer 13 is preferably 50 nm or less.

The non-thermal expansion layer 12 is formed by e.g. SiO on the thermal expansion layer 13. By the way, silicon oxide is represented by SiO in this specification. The SiO film 13 can be formed by CVD or sputtering. A thickness of the SiO film 13 can be 50 to 200 nm, and the representative thickness is 100 nm. The non-thermal expansion layer 12 does not expand even the lower metal layer 13 thermally expands, consequently, generates a stress at the interface with the metal layer 13 underneath; thus, peeling off between the non-thermal expansion layer 12 and the thermal expansion layer 13 occurs after irradiation of the laser beam.

Another necessary characteristics of the non-thermal expansion layer 12 is low thermal conductivity. The reason is to prevent the heat of the thermal expansion layer 13 from conducting to the upper layers so that the temperature of the thermal expansion layer 13 can easily be raised.

A metal layer as the adhesive layer 11 is formed on the non-thermal expansion layer 12. The metal layer 11 is formed by e.g. Al in a thickness of 10 nm or less. The role of the metal layer 11 is to improve adhesive strength between the polyimide film 100 and the multilayer film 20. From this point, a thickness of the adhesive layer 11 needs to be 5 nm or more; however, considering its role as an adhesive layer, a thickness of 50 nm or less is enough. The material for the adhesive layer 11 can be Cr, Ti, and forth, as well as Al.

The adhesive layer 11 remains on the TFT substrate 100 even after the glass substrate 500 is removed. In the case of the organic EL display device, a light transmittance of the adhesive layer 11 does not raise a problem. In the case of the liquid crystal display device, which is explained later, the adhesive layer 11 must be transparent to transmit back light; for that requirement, the adhesive layer is formed by e.g. Al of a thickness of 10 nm or less.

In FIG. 4, the polyimide film, which constitutes the TFT substrate 100 is formed on the adhesive layer 11 in a thickness of 10 to 20 microns. The polyimide film 100 is formed as that: the polyamic acid, which is precursor of polyimide, is coated by e.g. slit coater and is baked at 300 to 500 centigrade.

Since adhesive strength between the glass and polyimide is not enough, the polyimide substrate 100 easily peels off if it is directly coated on the glass substrate 500; consequently, it cannot pass through the manufacturing process of the organic EL display device. The adhesive layer 11 is formed to prevent peel off of the polyimide substrate 100 from the glass substrate 500.

Figure 10:
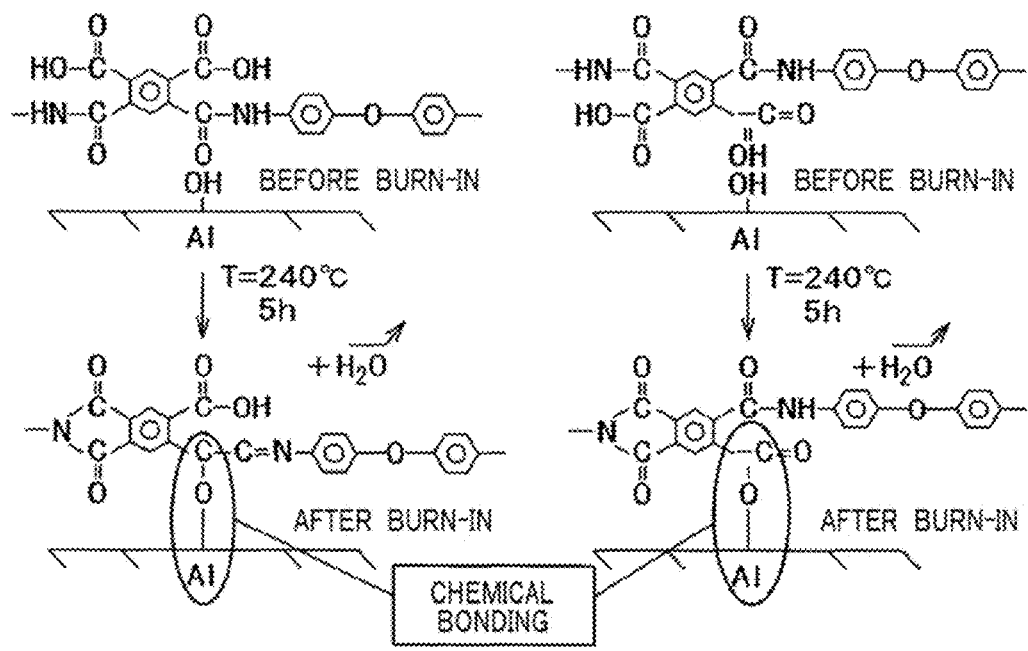
FIG. 10 is a model that shows polyimide bonds with the Al atoms.

The reaction shown in FIG. 10 explains how the adhesive strength with the polyimide substrate 100 is improved when Al is used for the adhesive layer 11. Namely, in an imide bonding process from the polyamic acid to the polyimide, the amide group and the carboxyl group, which originally react in intra molecular reaction, individually reacts with OH group of AlOOH by dehydration reaction. Even mechanism is slightly different, Cr, Ti and forth can be used as the adhesive layer 11 to improve adhesive strength between the glass substrate 500 and the polyimide film 100.

If the purpose is only to strengthen the adhesive strength between the polyimide substrate 100 and glass substrate 500, forming only the adhesive layer 11 on the glass substrate 500 will do; this structure, however, has a problem when the glass substrate 500 is removed from the TFT substrate 100 after the display panel is completed. The present invention enables to maintain necessary adhesive strength between the glass substrate 500 and the TFT substrate 100 during in the manufacturing process, and enables to remove securely the glass substrate 500 from the TFT substrate 100 after the display device is completed, by forming the multilayer film 20 between the glass substrate 500 and TFT substrate 100.

Figure 5:
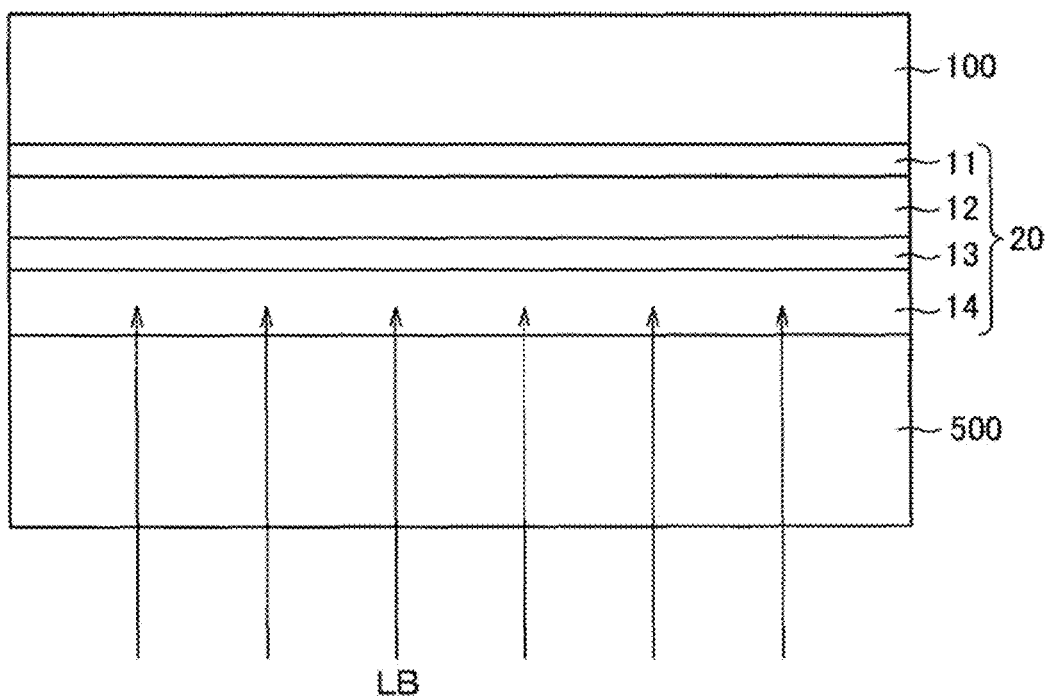
FIG. 5 is a cross sectional view that the laser beam is irradiated to separate the TFT substrate and the glass substrate.

FIG. 5 is a cross sectional view that the laser beam (LB) is irradiated to the multilayer film 20 to remove the glass substrate 500 from the TFT substrate 100. The laser beam (LB) has energy peaks at wavelength of 308 nm and at 355 nm; and the energy density of the laser beam is 90 to 100 mJ/cm$^2$. This energy density is not high enough to melt the a-Si film 14.

Figure 11:
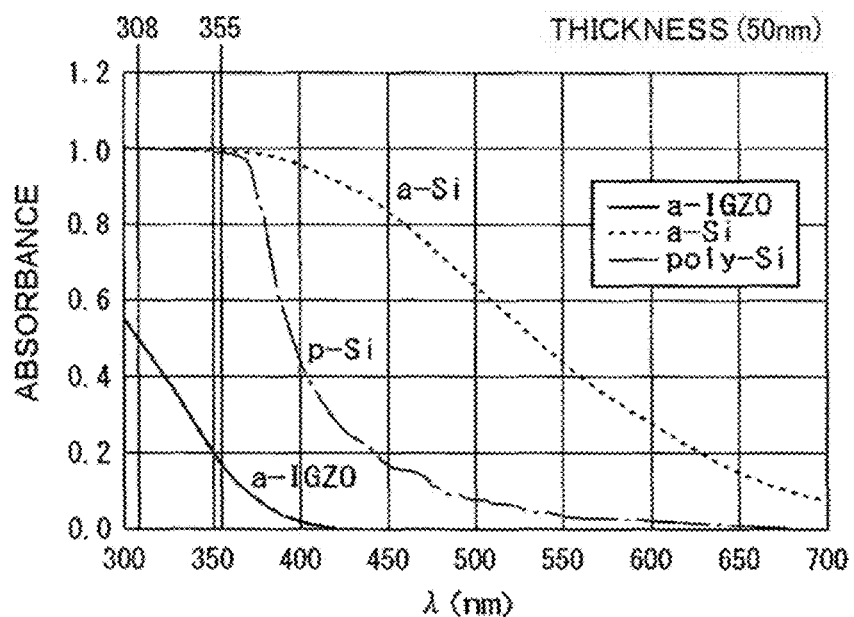
FIG. 11 is a graph of spectral absorbance of the laser beam by several semiconductors.

FIG. 11 is a graph that shows absorbing characteristics of the laser beam by the a-Si film, the poly-Si film, and the a-IGZO film when each thickness is 50 nm. In FIG. 11, the abscissa is wave length (nm), the ordinate is absorption rate. As shown in FIG. 11, the a-Si film and the poly-Si film absorb 100% of the ultra violet laser beam of wave length of 308 nm and 355 nm. Namely, photo-heat conversion can be performed efficiently by using the laser beam of those wave lengths.

The heat generated in the a-Si film, which is the photo heat conversion layer 14, raises the temperature of thermal expansion layer 13, which is formed in contact with the photo heat conversion layer 14. Since the thermal conductivity of the glass is very low, most of the heat generated in the photo heat conversion layer 14 is absorbed in the thermal expansion layer 13. The thermal expansion layer 13 needs to have a big thermal expansion coefficient and a big thermal conductivity. From this point, as shown in FIG. 32, Al is very suitable. The Al can be an Al alloy which other metals are added in a small amount in Al.

The role of the photo heat conversion layer 14 in this invention is to supply heat to the thermal expansion layer 13; thus, the energy is not necessary up to melt the photo heat conversion layer 14. Further, the function of the present invention is to remove the glass substrate 500 from the TFT substrate 100 by stress generated by difference in thermal expansions between the thermal expansion layer 13 and the non-thermal expansion layer 12, which is formed on the thermal expansion layer 13; thus, it is not necessary to melt the metal that constitutes the thermal expansion layer 13.

Figure 12:
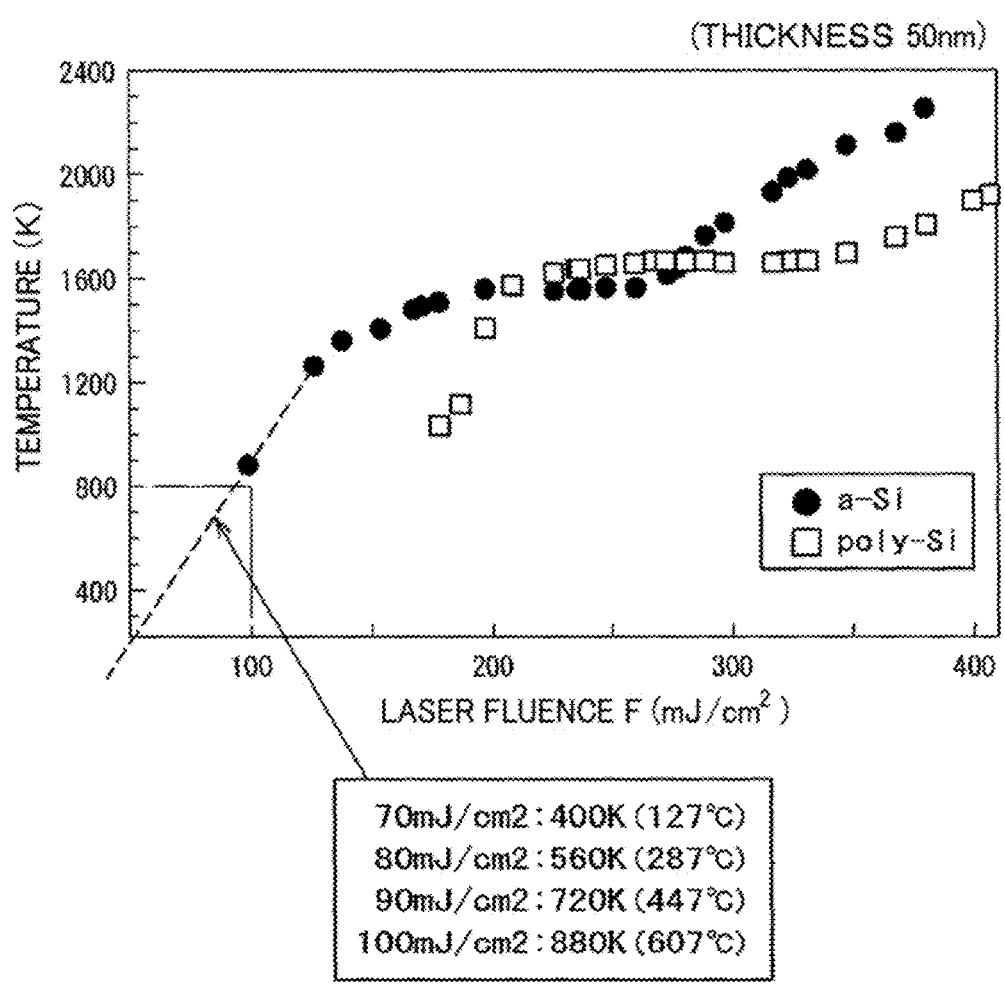
FIG. 12 is a graph that shows relation between the energy density of the laser beam and the temperature of the semiconductor layers.

FIG. 12 is a graph that shows the relation between the energy density F (Laser Fluence mJ/cm$^2$) and temperature rise of the a-Si film and the poly-Si film when the laser beam, which has energy peaks at 308 nm and 355 nm, is irradiated to the a-Si film and to the poly-Si film of a thickness of 50 nm. In FIG. 12, the abscissa is the energy density F (Laser Fluence mJ/cm$^2$) and the ordinate is temperature of the a-Si film or the poly-Si film.

As depicted in lower side of FIG. 12, the temperature of the a-Si film is 447 centigrade when energy density of the laser beam is 90 (mJ/cm$^2$); the temperature of the a-Si film is 607 centigrade when energy density of the laser beam is 100 (mJ/cm$^2$). Since melting temperature of Al is 660 centigrade, Al film does not melt even when the thermal expansion layer (the Al film) 13 becomes as high as the temperature of the a-Si film, which constitutes the photo heat conversion layer 14, when energy density of the laser beam is 90 (mJ/cm$^2$). The thermal expansion of the Al film 13, however, is very big.

Figure 6:
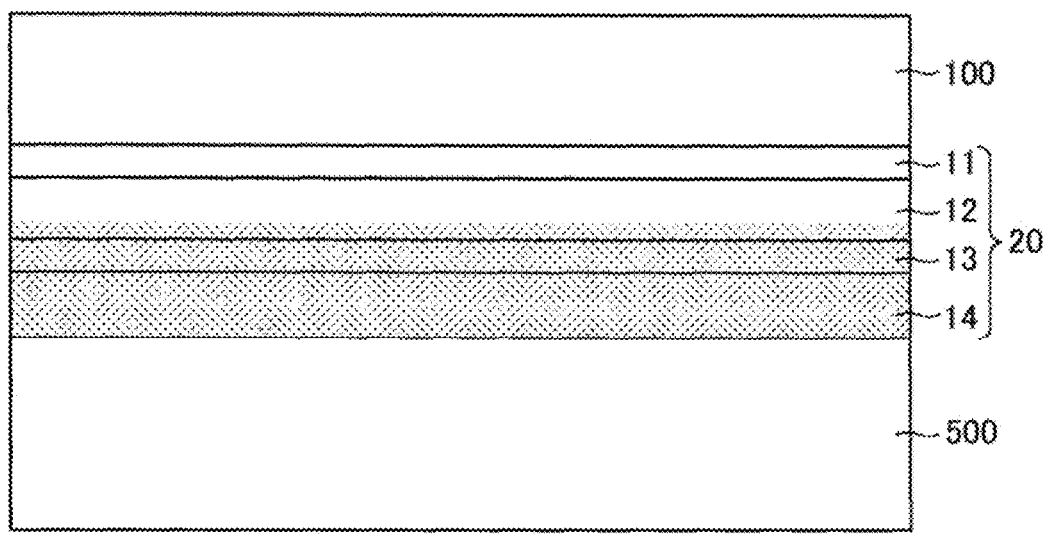
FIG. 6 is a cross sectional view of temperature distribution in the multilayer film when laser beam is irradiated.

FIG. 6 is a cross sectional view that the a-Si film, which is the photo heat conversion layer 14, is heated by irradiating the laser beam; the heat conducts to the thermal expansion layer 13 and to a part of the non-thermal expansion layer 12. In FIG. 6, shaded area by dots depicts the heated portions. The heat generated in the a-Si film 14 immediately conducts to the Al film, which constitutes the thermal expansion layer 13. The heat, however does not conduct to upper direction because the SiO film, which constitutes non-thermal expansion layer 12, has a low heat conductivity as well as a low thermal expansion coefficient. The heat conductivity of SiO is 1.5 (W/mK), while the heat conductivity of Al is 236 (W/mK) as shown in FIG. 32.

Therefore, most heat generated in the a-Si film 14 is used to expand the thermal expansion layer 13. In addition, the thermal expansion coefficient of Al, which constitutes the thermal expansion layer 13, is 23.1 (10$^{-6}$/K), which is much bigger than the thermal expansion coefficient 0.5 (10$^{-6}$/K) of SiO, which constitutes non-thermal expansion layer 12. Thus, big stress is generated between the thermal expansion layer 13 and the non-thermal expansion layer 12.

Figure 7:
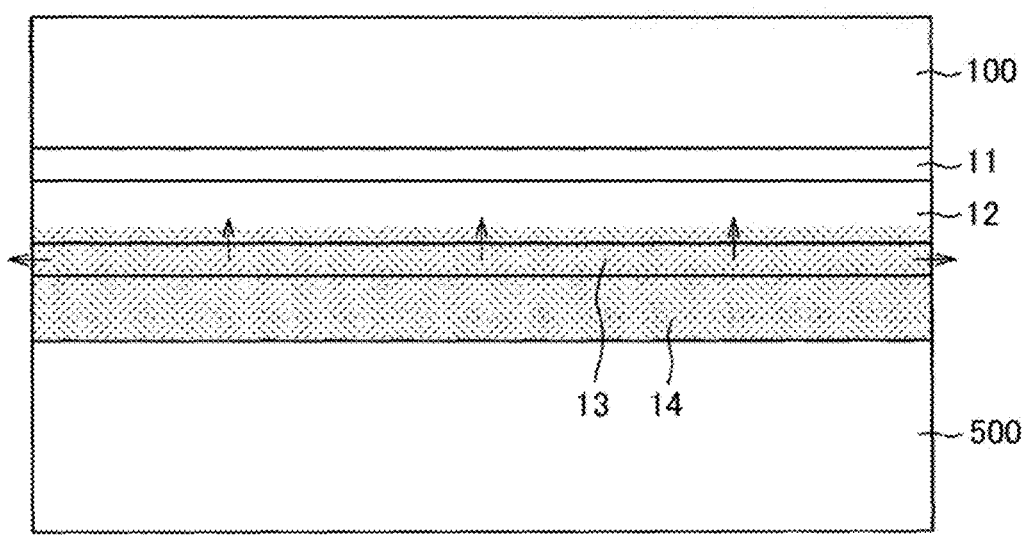
FIG. 7 is a cross sectional view that shows the stress when the thermal expansion layer expands.

FIG. 7 is a cross sectional view of the above explained mechanism. Namely, the SiO film 12, which heat does not conduct and the thermal expansion coefficient is low, does not expand practically. On the contrary, the aluminum film 13, which has a big thermal conductivity and a big thermal expansion coefficient, tries to expand as shown by arrows in FIG. 7, thus, a big stress is generated between the SiO film 12 and the Al film 13.

Figure 8:
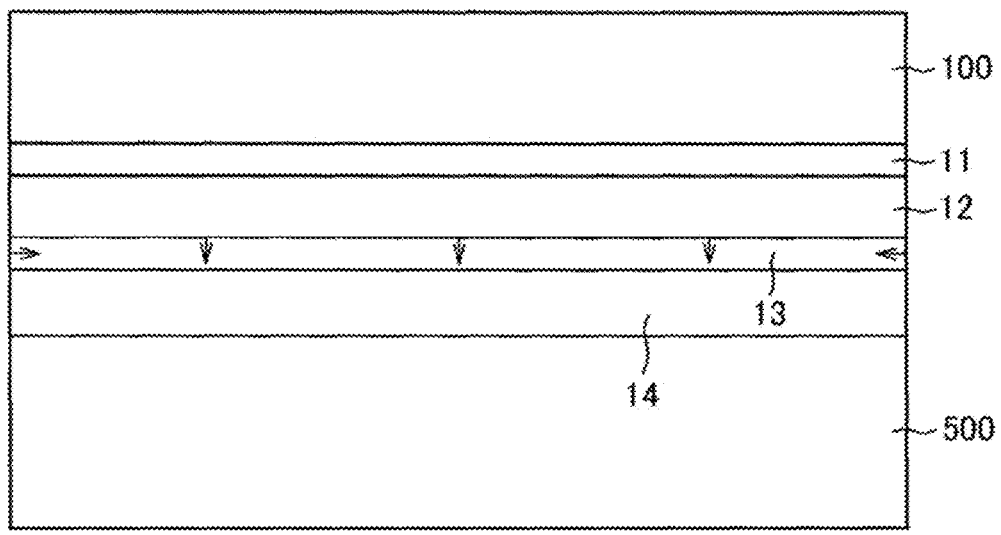
FIG. 8 is a cross sectional view that shows the stress when the thermal expansion layer sharply shrinks by rapid cool off.

On the other hand, duration time of laser beam irradiation is in an order of 10 nanosecond. The thermal expansion layer 13 rapidly cools down and shrinks after termination of irradiation of the laser beam. Consequently, a reverse stress, compared with the stress when the thermal expansion layer 13 expands, is generated at the interface between the thermal expansion layer 13 and the non-thermal expansion layer 12. This mechanism is depicted in FIG. 8. As a result, the stresses in different direction is applied in short period to the interface between the thermal expansion layer 13 and non-thermal expansion layer 12; consequently, the interface is broken and thus, peeling off occurs at the interface of the thermal expansion layer 13 and non-thermal expansion layer 12. It is depicted in FIG. 9.

Figure 9:
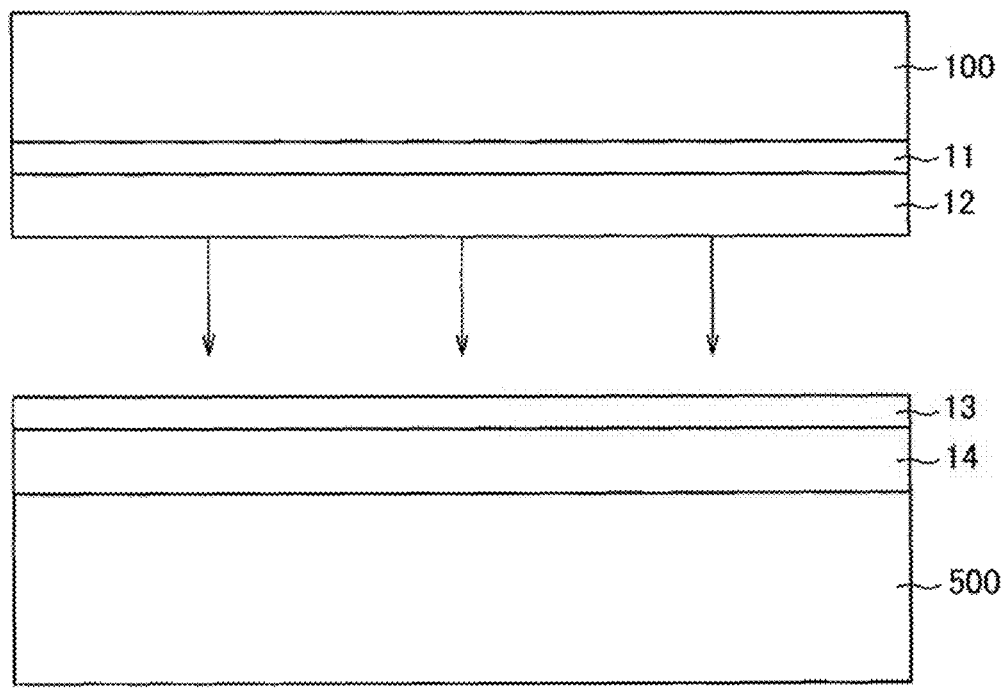
FIG. 9 is a cross sectional view that shows the TFT substrate and the glass substrate are separated according to the present invention.

As shown in FIG. 9, the thermal expansion layer 13 and the photo heat conversion layer 14 are removed with the glass substrate 500; however, the adhesive layer 11 and the non-thermal expansion layer 12 remain on the TFT substrate 100. In general, however, there occurs non uniformity in material organization at the interface between the thermal expansion layer 13 and non-thermal expansion layer 12; therefore, in actual manufacturing process, the glass substrate 500 and the TFT substrate 100 can be separated under the condition when the thermal expansion layer 13 and non-thermal expansion layer 12 are partly not separated. The thickness of the adhesive layer 11 is e.g. 10 nm and non-thermal expansion layer 12 is e.g. 100 nm, they do not raise a problem to the outer look. The light transmittance of those films does not raise a problem in the organic EL display device. In the case of the liquid crystal display device, the back light is necessary and the light transmittance in the adhesive layer 11 and the non-thermal expansion layer 12 can be an important problem, however, as explained later, this problem can be overcome by selecting the thickness of the layers.

Figure 13:
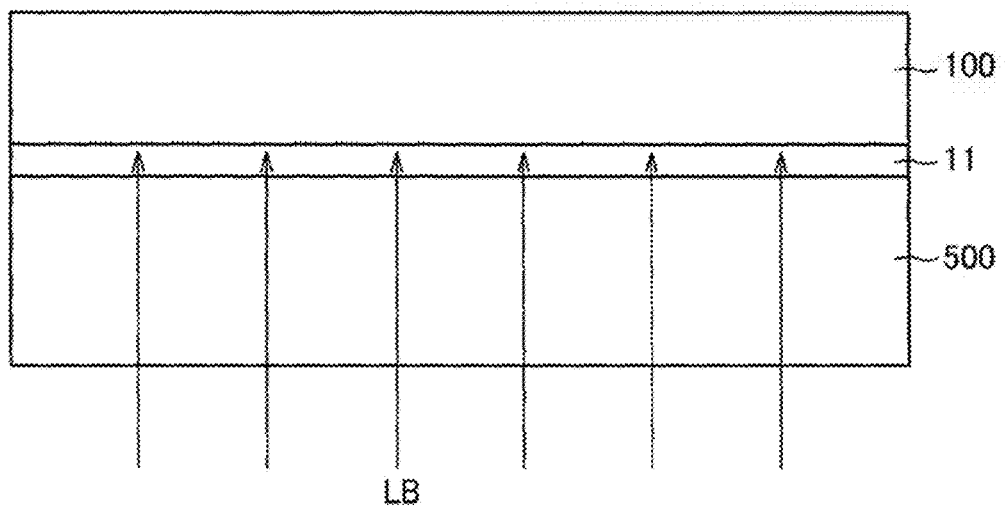
FIG. 13 is a cross sectional view that shows method to separate the TFT substrate and the glass substrate without using the present invention.
Figure 14:
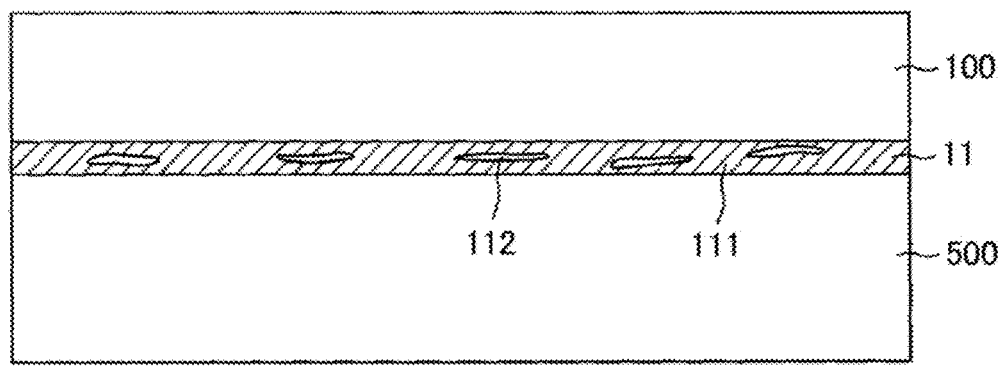
FIG. 14 is a cross sectional view that the adhesive layer is melt or vaporized as a result the laser beam is irradiated to the adhesive layer of FIG. 13.
Figure 15:
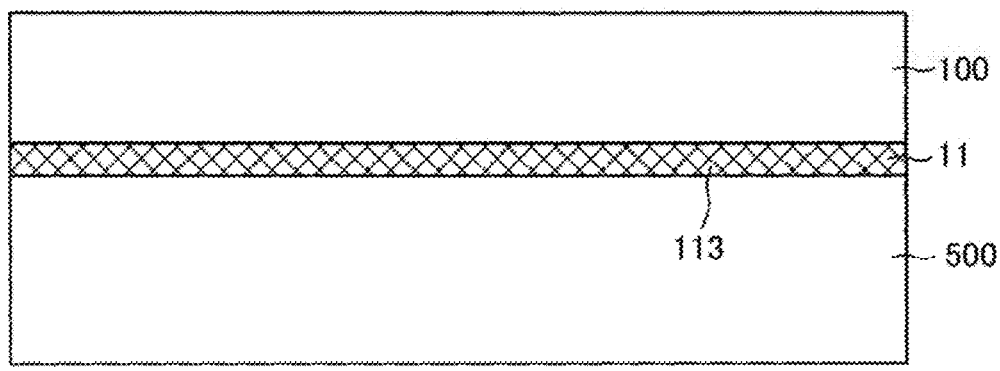
FIG. 15 is a cross sectional view that the adhesive layer, which has been melt or vaporized, coagulates again, and thus, the TFT substrate and the glass substrate are adhered.

FIGS. 13 to 15 are the cross sectional views that show a problem when the present invention is not used. FIG. 13 shows the TFT substrate 100, which is made of polyimide, is formed on the glass substrate 500 via the adhesive layer 11. In FIG. 13, the adhesive layer 11, which is made of metal as Al, Cr, Ti, and so forth, is formed to increase the adhesive strength between the polyimide substrate 100 and the glass substrate 500. A thickness of the adhesive layer 11 is e.g. 10 nm.

The substrate 100 passes through the manufacturing process under this state; after the organic El display device is completed, the laser beam (LB) is irradiated at the adhesive layer 11 formed between the glass substrate 500 and the TFT substrate 100 made of polyimide to eliminate the glass substrate 500 from the TFT substrate 100, as depicted in FIG. 3. This removal is made by melting or vaporizing the metal that constitutes the adhesive layer 11. This is depicted in FIG. 14. In this process, the adhesive layer 11 needs to be melted, thus, energy density of the laser beam needs to be 110 mJ/cm$^2$ to 210 mJ/cm$^2$, which is higher than the energy density needed in the present invention. In addition, since metal reflects the laser beam of wave length 308 nm to 355 nm, the absorbance is as small as 10 to 50%; thus, when the reflection is counted, the several times of above energy density is necessary.

In FIG. 14, the adhesive layer 11 is melted as depicted by 111 and partly vaporized as depicted by 112. The laser beam, however, is irradiated for a short time; after termination of the laser beam irradiation, the adhesive layer 11 rapidly cools off. Subsequently, as shown in FIG. 15, the metal, which constitutes the adhesive layer 11, coagulates as depicted by 113; as a result, the glass substrate 500 and the TFT substrate 100 cannot be separated. On the contrary, in the present invention as described above, the separation is made by the stress caused by differences of thermal expansion between the layers other than the adhesive layer 11; thus, separation of the TFT substrate 100 and the glass substrate 500 can be attained securely.

Embodiment 2

Figure 16:
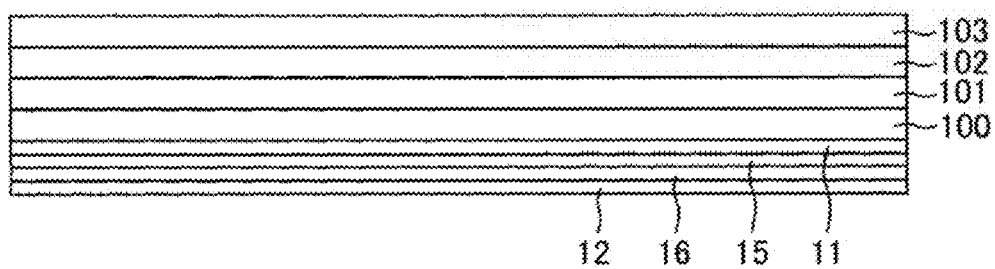
FIG. 16 is a cross sectional view of embodiment 2.

FIG. 16 is a cross sectional view of the organic EL display device according to embodiment 2. FIG. 16 corresponds to a cross sectional view along the line A-A of FIG. 1. FIG. 16 differs from FIG. 2 of embodiment 1 in that the aluminum oxide layer (represented by AlO herein after) 16 and the SiO layer 15 are formed between the adhesive layer 11 made of metal and the non-thermal expansion layer 12 made of SiO. The AlO layer 16 and the SiO layer 15 are barrier layers against moisture and so forth. Other structures in FIG. 16 are the same as explained in FIG. 2.

Figure 17:
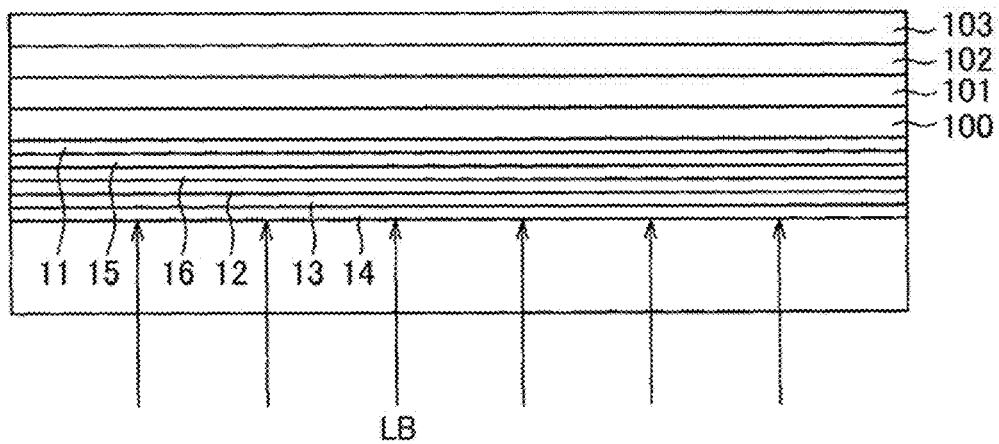
FIG. 17 is a cross sectional view that the laser beam is irradiated to separate the glass substrate from the TFT substrate in embodiment 2.

FIG. 17 is a cross sectional view of interim structure in the manufacturing process for the structure of FIG. 16. FIG. 17 differs from FIG. 3 of embodiment 1 in that there are six layers between the glass substrate 500 and the TFT substrate 100. Namely, the AlO layer 16 and the SiO layer 15 for barrier layers are added between the adhesive layer 11 and the non-thermal expansion layer 12.

In FIG. 17, the laser beam (LB) is irradiated to separate the TFT substrate 100 and the glass substrate 500; most of the laser beam is absorbed in the phot heat conversion layer 14 and the heat is absorbed by the heat expansion layer 13 as explained in FIG. 3 of embodiment 1.

Figure 18:
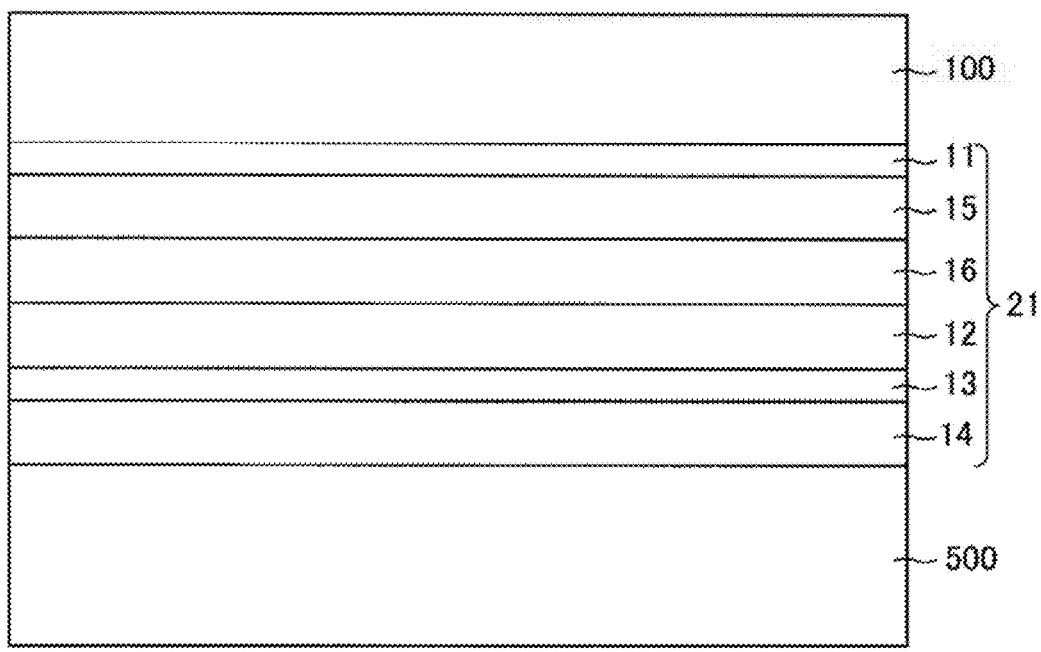
FIG. 18 is a cross sectional view of the structure before the TFT substrate and the glass substrate are separated according to embodiment 2.

FIG. 18 is a cross sectional view that shows the TFT substrate 100, glass substrate 500, and the multilayer film 21 between them. FIG. 18 differs from FIG. 4 of embodiment 1 in that AlO layer 16 and the SiO layer 15 as barrier layers are formed between the adhesive layer 11 and the non-thermal expansion layer 12. The SiO layer 15 is formed by sputtering or CVD in a thickness of 100 to 200 nm.

The AlO layer 16 is formed by sputtering under the SiO layer 15. The AlO layer 16 of thickness of approximately 50 nm can have enough effect as a barrier layer; however, a thickness of 100 nm is further preferable for a barrier layer. Under the AlO layer 16, the SiO film as the non-thermal expansion layer 12, the metal film e.g. the Al film as the thermal expansion layer 13 and the a-Si film as the photo heat conversion layer 14 are formed. In the structure of FIG. 18, the AlO layer 16 is sandwiched by SiO layer 15 and the SiO film 12. The SiO film 12 as the non-thermal expansion layer 12, the metal film of Al film as the thermal expansion layer 13, and a-Si film as the photo heat conversion layer 14 are the same as explained in embodiment 1.

Figure 19:
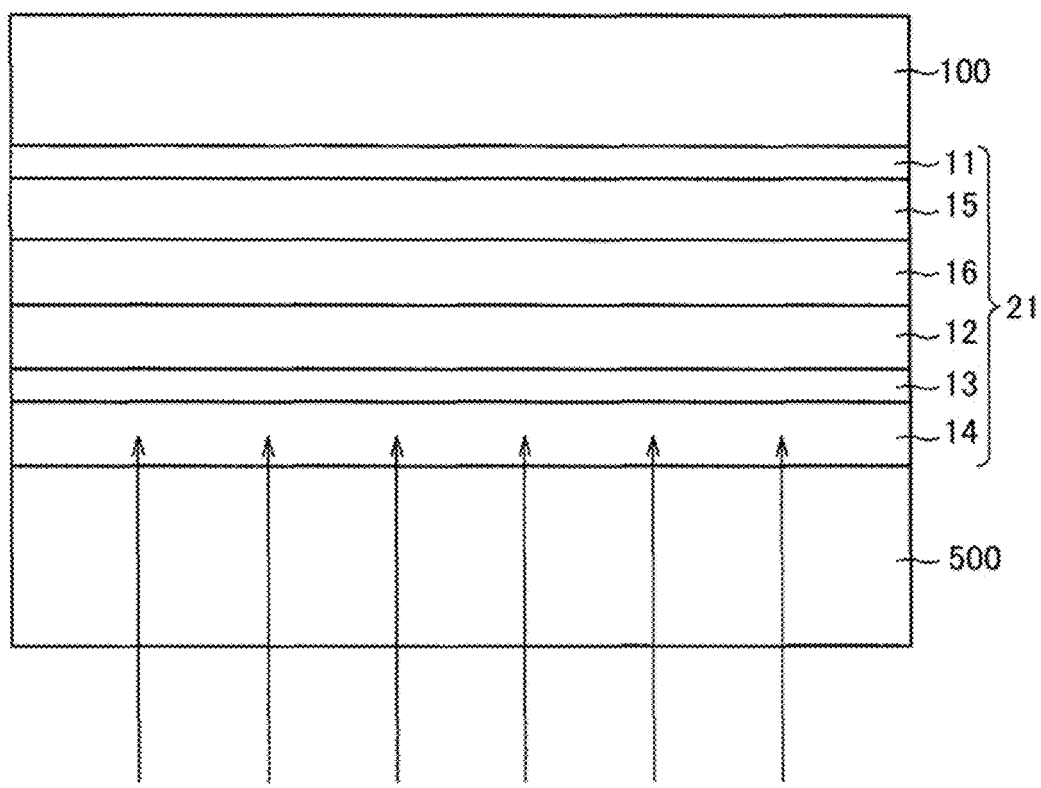
FIG. 19 is a cross sectional view that the laser beam is irradiated to the photo heat conversion layer to separate the glass substrate from the TFT substrate in embodiment 2.

FIG. 19 is a cross sectional view that the laser beam (LB) is irradiated on the photo heat conversion layer 14 in the multilayer film 21 to separate the TFT substrate 100 and the glass substrate 500. The condition of laser beam irradiation, mechanism of peeling off of the substrates are the same as explained in embodiment 1. Namely, the heat generated in the photo heat conversion layer 14 is absorbed in the heat expansion layer 13; the heat, however, does not conduct to the upper layers than the non-thermal expansion layer 12 since thermal conductivity of the non-thermal expansion layer 12, formed on the thermal expansion layer 13, is low. Thus, thermal influence due to the AlO layer 16 and SiO layer 15 formed upper side than the non-thermal expansion layer 12 can be neglected.

Figure 20:
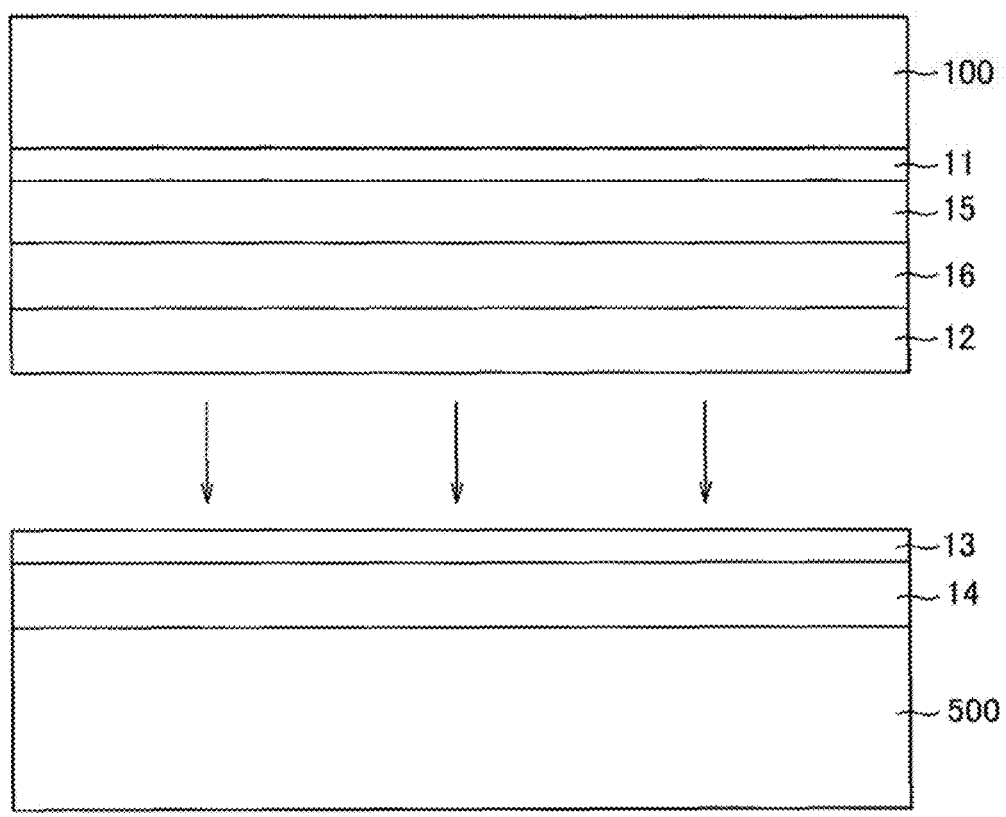
FIG. 20 is a cross sectional view that shows the glass substrate is separated from the TFT substrate in embodiment 2.

FIG. 20 is a cross sectional view that glass substrate 500 is separated from the TFT substrate 100. In FIG. 20, the adhesive layer 11, barrier layers of AlO layer 16 and SiO layer 15, and non-thermal expansion layer 12 exist on the TFT substrate 100. Those films are thin films; therefore, they do not influence to the outer dimensions of the display panel. In addition, the organic EL display device does not have a back light; thus, they do not raise an optical problem, either. On the other hand, the thermal expansion layer 13 and the photo heat conversion layer 14 exist on the glass substrate 500 as the same in embodiment 1.

In addition to the effect explained in embodiment 1, the structure of embodiment 2 can effectively suppress e.g. the moisture intruding from outside through the polyimide; consequently, deterioration of the organic EL layer can be suppressed, thus, reliability of the display device can be improved. In addition, if the TFT is made of the oxide semiconductor, the fluctuation of the characteristics of the TFT, due to influence of e.g. moisture from outside, can be suppressed.

Embodiment 3

Figure 21:
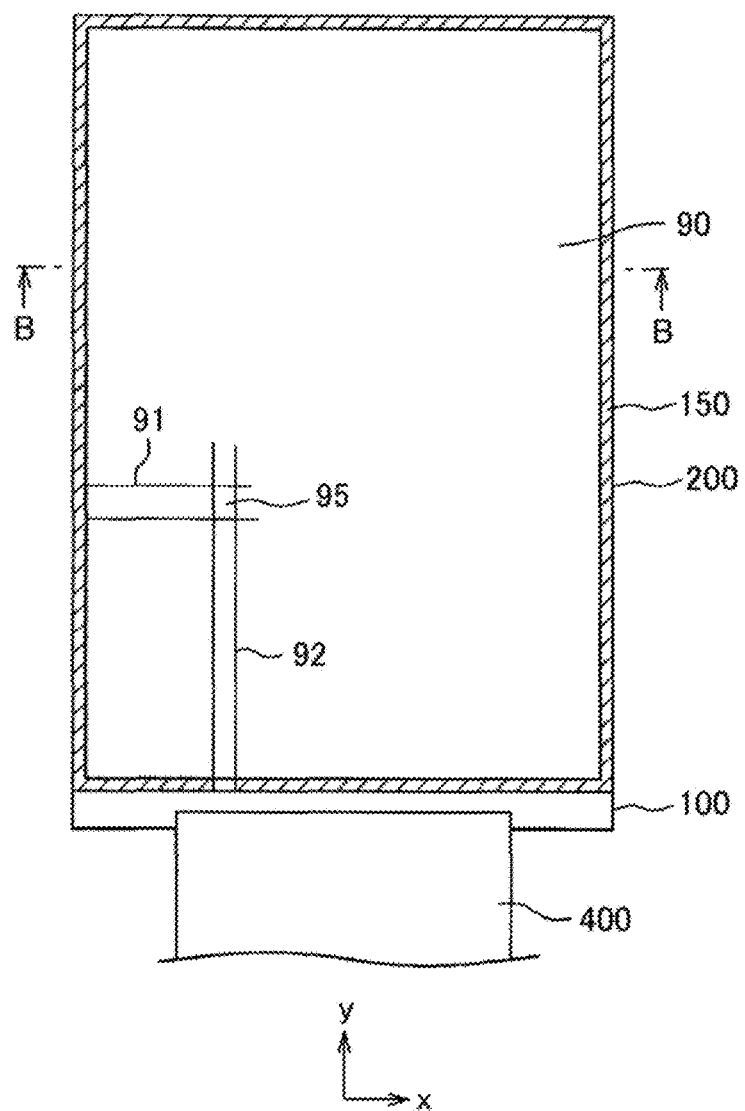
FIG. 21 is a plan view of the liquid crystal display device.

The present invention can also be applied to the liquid crystal display device. In some occasions, the liquid crystal display device is also required to be a flexible display device. FIG. 21 is a plan view of the liquid crystal display device. In FIG. 21, the TFT substrate 100 and the counter substrate 200 are adhered by the sealant 150; the liquid crystal is sandwiched between the TFT substrate 100 and the counter substrate 200, and is sealed inside of the sealant 150.

The display area 90 is made where the TFT substrate 100 and the counter substrate 200 overlap. In the display area 90, the scan lines 91 extend in lateral direction (x direction) and are arranged in longitudinal direction (y direction). The video signal lines 92 extend in longitudinal direction and are arranged in lateral direction. The pixel 95 is formed in the area surrounded by scan lines 91 and the video signal lines 92. The TFT substrate 100 is made bigger than the counter substrate 200; the area where the TFT substrate 100 does not overlap with the counter substrate 200 is the terminal area. The flexible wiring substrate 400 is connected to the terminal area to supply powers and signals to the liquid crystal display device.

Figure 22:
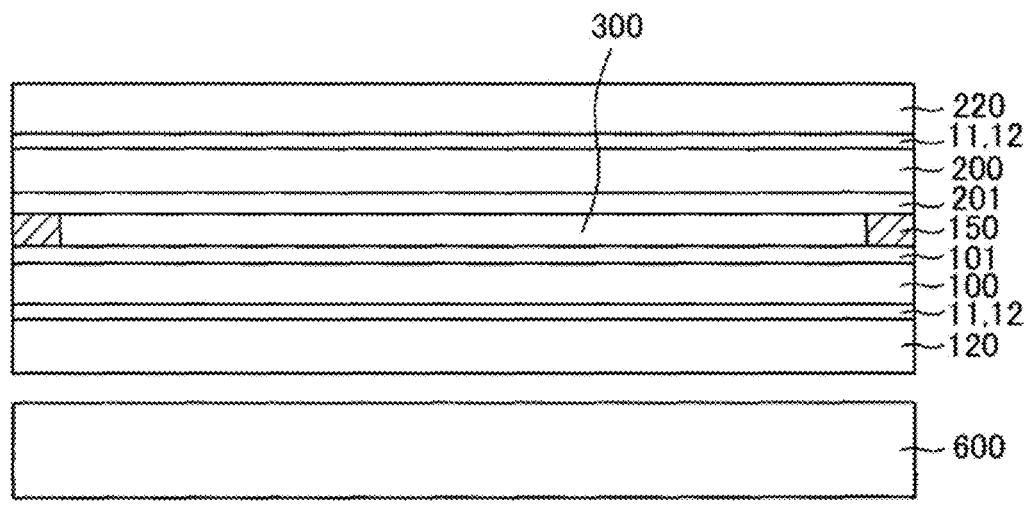
FIG. 22 is a cross sectional view along the line B-B of FIG. 21.

FIG. 22 is a cross sectional view of FIG. 21 along the line B-B. In FIG. 22, the TFT wiring layer 101 is formed on the TFT substrate 100, which is made of polyimide; the color filter layer 201 is formed on the counter substrate 200, which is made of polyimide. The TFT substrate 100 and the counter substrate 200 are adhered by the sealant 150; the liquid crystal 300 is sealed inside the sealant 150.

In FIG. 22, the adhesive layer 11 and non-thermal expansion layer 12 that are explained in embodiment 1 are formed on the outside surfaces of the TFT substrate 100 and the counter substrate 200. On the outside of the adhesive layer 11 and the non-thermal expansion layer 12 of the counter substrate 200, the upper polarizer 220 is adhered; on the outside of the adhesive layer 11 and the non-thermal expansion layer 12 of the TFT substrate 100, the lower polarizer 120 is adhered.

In FIG. 22, the back light 600 is disposed at the back of the lower polarizer 120. If a sheet type light source, formed by e.g. organic EL light, is used for the back light 600, the liquid crystal display device can maintain flexibility as a whole.

Figure 23:
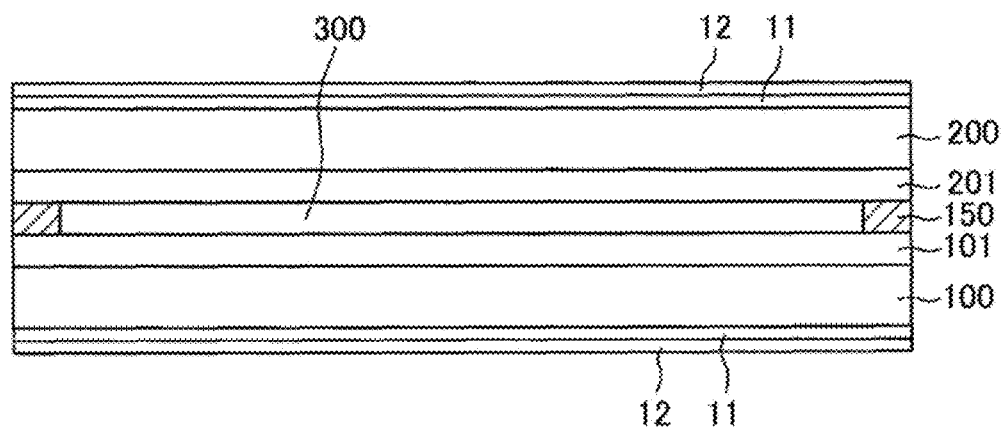
FIG. 23 is a cross sectional view of the liquid crystal display panel according to embodiment 3.
Figure 24:
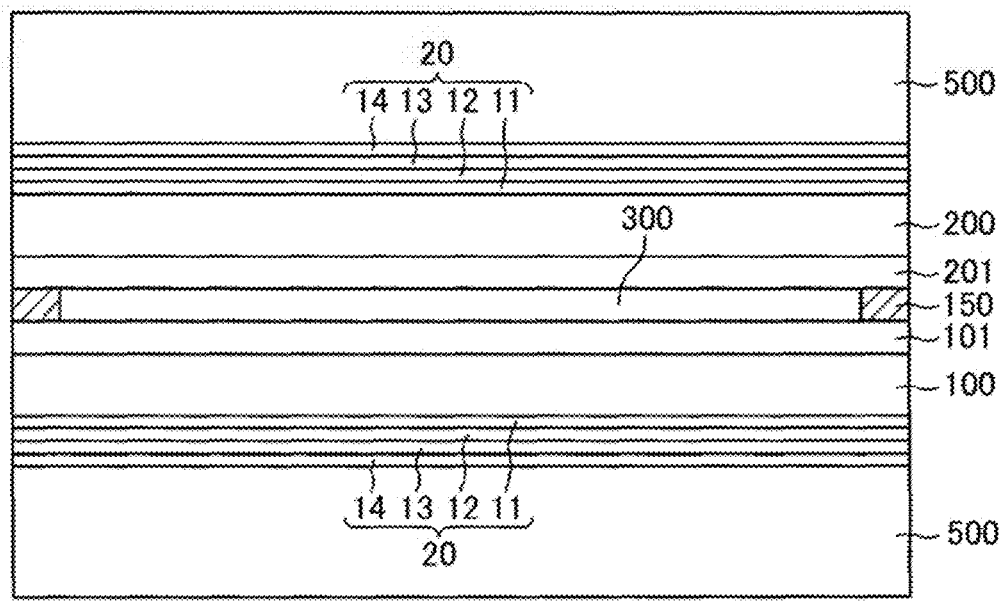
FIG. 24 is a cross sectional view before the glass substrate is separated from the liquid crystal display panel according to embodiment 3.

FIG. 23 is a cross sectional view of the liquid crystal display panel, where the upper polarizer 220 and the lower polarizer 120 are removed. In FIG. 23, on the outer surfaces of the TFT substrate 100 and the counter substrate 200, the metal layer as the adhesive layer 11 and the SiO layer as the non-thermal expansion layer 12 are formed. Such a liquid crystal display panel is formed as follows. As depicted in FIG. 24, the TFT wiring layer 101 is formed on the TFT substrate 100 formed on the glass substrate 500; the color filter layer 201 is formed on the counter substrate 200 formed on the glass substrate 500; the liquid crystal 300 is filled and sealed by the sealant 150, which adheres the TFT substrate 100 and the counter substrate 200.

In this state, the multilayer film 20, comprising the metal layer as the adhesive layer 11, the non-thermal expansion layer 12, the thermal expansion layer 13, and the photo heat conversion layer 14, is formed between the TFT substrate 100 and the glass substrate 500 and between the counter substrate 200 and the glass substrate 500. The structure and the function of each of the layers are the same as explained in embodiment 1.

Figure 25:
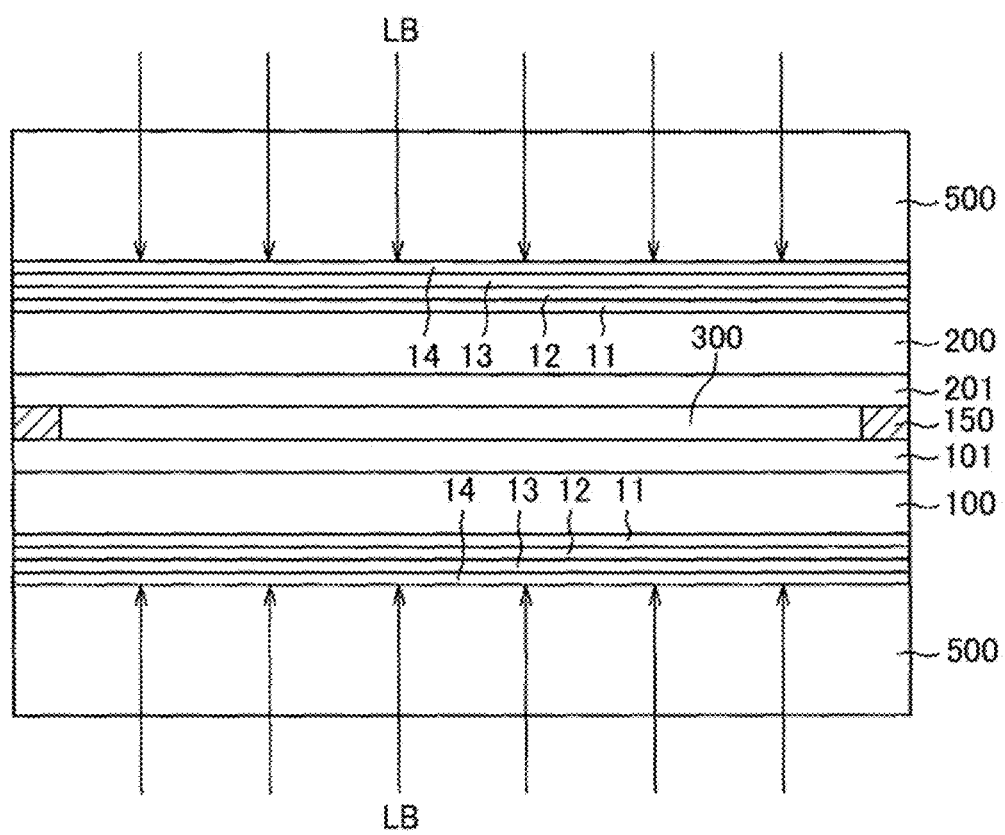
FIG. 25 is a cross sectional view that the laser beam is being irradiated to separate the glass substrate from the liquid crystal display panel according to embodiment 3.

After that, as shown in FIG. 25, the laser beam (LB) is irradiated on the photo heat conversion layer 14 to expand the thermal expansion layer 13; subsequently, after the termination of the irradiation of the laser, the thermal expansion layer 13 shrinks to generate the stress between the non-thermal expansion layer 12 and the thermal expansion layer 13; thus, the glass substrate 500 is removed from the TFT substrate 100 or from the counter substrate 200. The condition for irradiation of the laser beam and the mechanism of the peeling off are the same as explained in embodiment 1.

Figure 26:
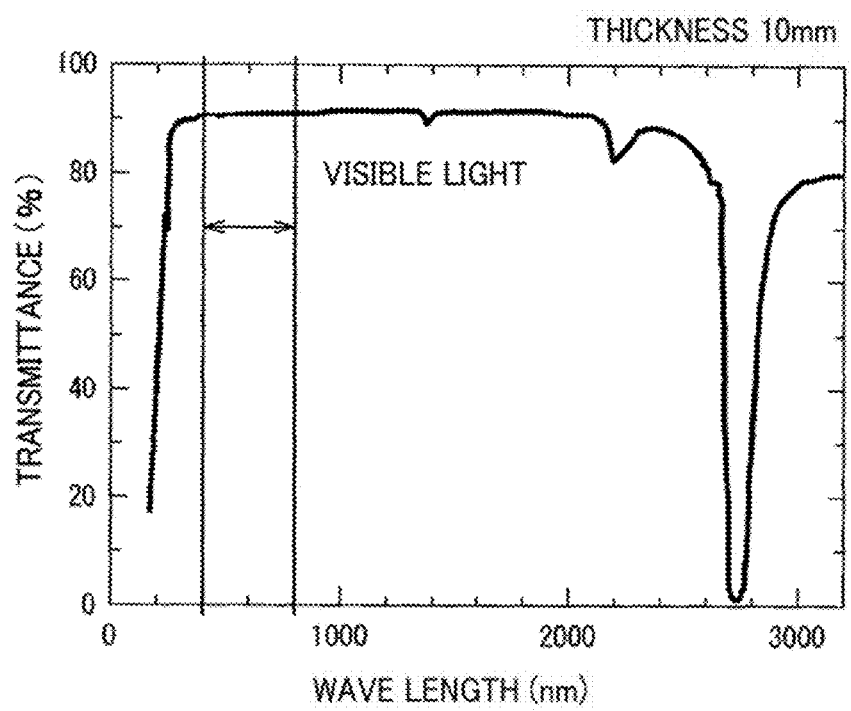
FIG. 26 is a graph of spectral absorbance of the silicon oxide film.

Back to FIG. 23, the liquid crystal display device differs from the organic EL display device in that it has a back light. Namely, the adhesive layer 11 and the non-thermal expansion layer 12 on the TFT substrate 100 or on the counter substrate 200 need to transmit the visible light. In FIG. 23, the non-thermal expansion layer 12 is made of SiO layer. FIG. 26 is a graph that shows the transmittance of light through the SiO film of thickness of 10 mm.

In FIG. 26, the abscissa is wave length (nm) and the ordinate is transmittance (%). As shown in FIG. 26, the transmittance of the SiO film is 90% even the thickness of the SiO film is 10 mm in the visible light. The transmittance of 90% is caused by a difference of refraction index at the interface. Therefore, the transmittance of the SiO film that constitutes the non-thermal expansion layer 12 has no problem to the brightness of the screen.

Figure 27:
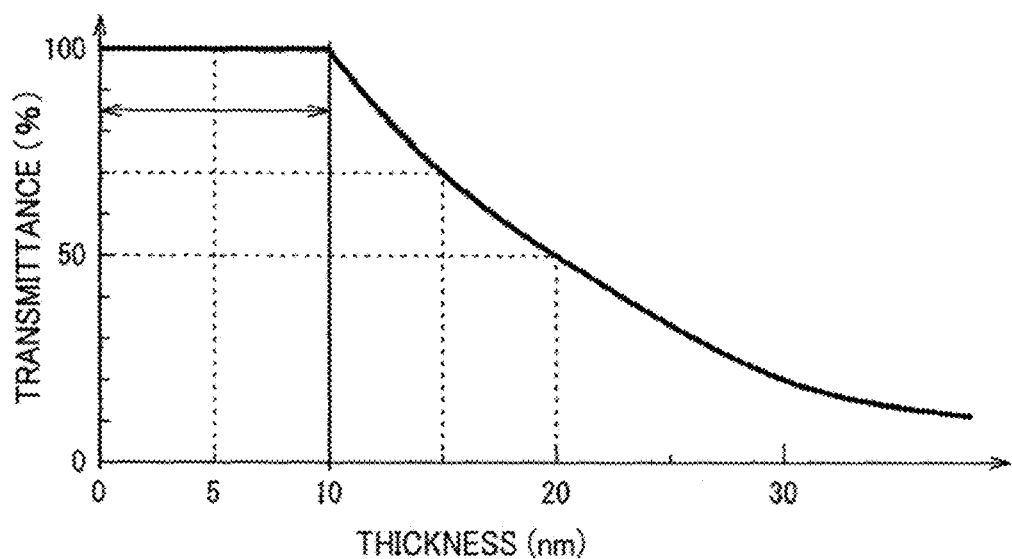
FIG. 27 is a graph that shows transmittance of visible light according to a thickness of the Al film.

On the other hand, the adhesive layer 11 is made of metal as e.g. Al, Cr, Ti, and so forth. Among them, Al becomes transparent when the thickness becomes 10 nm or less. FIG. 27 shows a transmittance characteristics of Al for the visible light. In this case, the visible light means green wave length (500 nm). In FIG. 27, the abscissa is the thickness of Al film, and the ordinate is transmittance. As shown by the arrow in FIG. 27, the transmittance of Al film is 100% up to a thickness of 10 nm; the transmittance decreases when the thickness becomes bigger than 10 nm. Therefore, as far as a thickness is 10 nm or less, the influence of Al film to the transmittance of visible light can be neglected.

Figure 28:
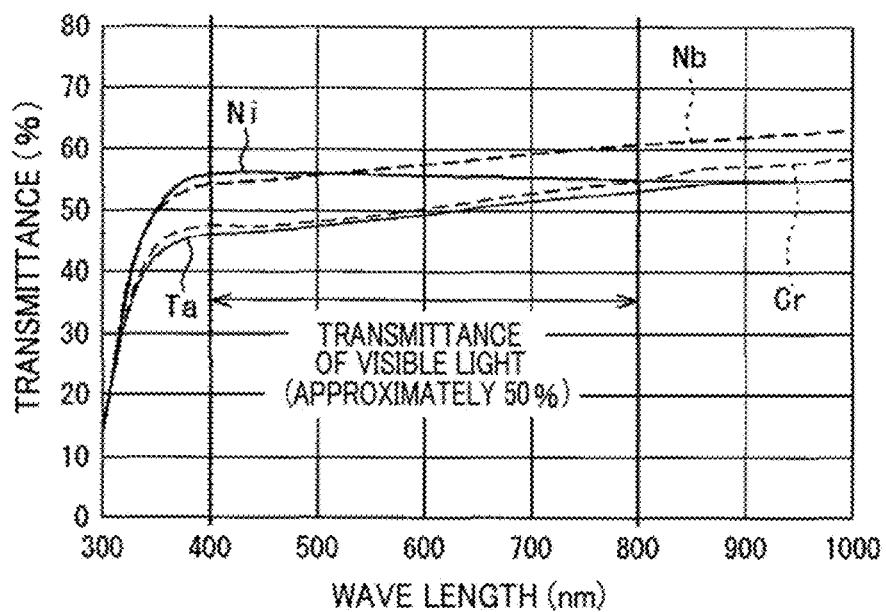
FIG. 28 is a graph that shows spectral transmittance of Cr, Nb, Ni, and Ta.

FIG. 28 is a graph of spectral light transmittance of Cr, Nb, Ni, Ta and so forth when the thickness is 6.5 nm. In FIG. 28, the abscissa is wavelength, and the ordinate is transmittance. In FIG. 28, for the case of Cr, the light transmittance in the visible light is approximately 50% even the thickness of the film is 6.5 nm. Therefore, using Cr for the adhesive layer 11 has a problem in the liquid crystal display device. However, it is not a problem in the organic EL display device.

As described above, even in the liquid crystal display device, the flexible display device can be produced stably in using the polyimide for the TFT substrate 100 and the counter substrate 200 according to the present invention.

Embodiment 4

Figure 29:
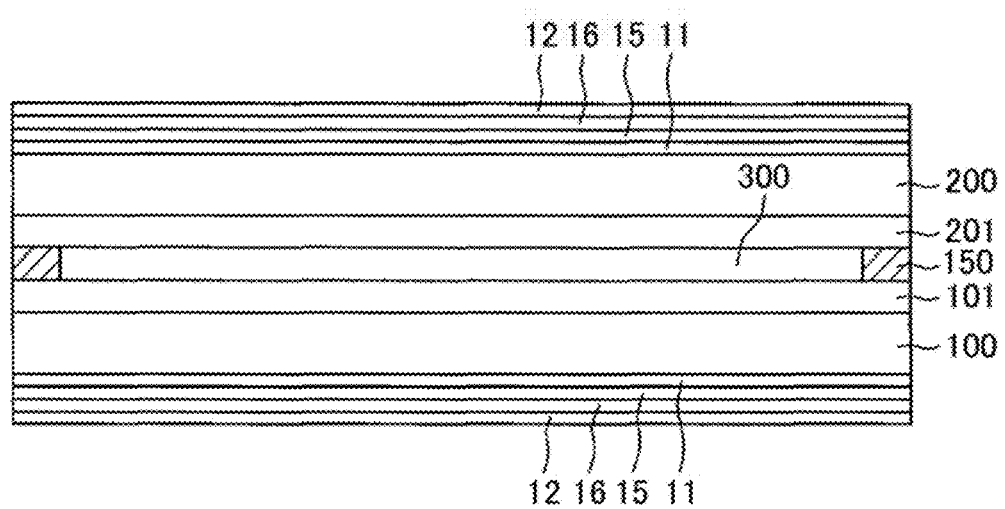
FIG. 29 is a cross sectional view of the liquid crystal display panel according to embodiment 4.

FIG. 29 is a cross sectional view of the liquid crystal display panel according to embodiment 4. FIG. 29 is a cross sectional view corresponds to FIG. 23 of embodiment 3. FIG. 29 differs from FIG. 23 in that the four layer laminated film is formed on the outer surface of the TFT substrate 100 and the counter substrate 200; the four layer laminated film comprises: the adhesive layer 11, the SiO layer 15, which constitutes a barrier layer, the AlO layer 16, which constitutes a barrier layer, and the non-thermal expansion layer 12. The structure of the laminated film of FIG. 29 is the same as the structure of the laminated film on the outside of the TFT substrate 100 of the organic EL display device in embodiment 2.

Figure 30:
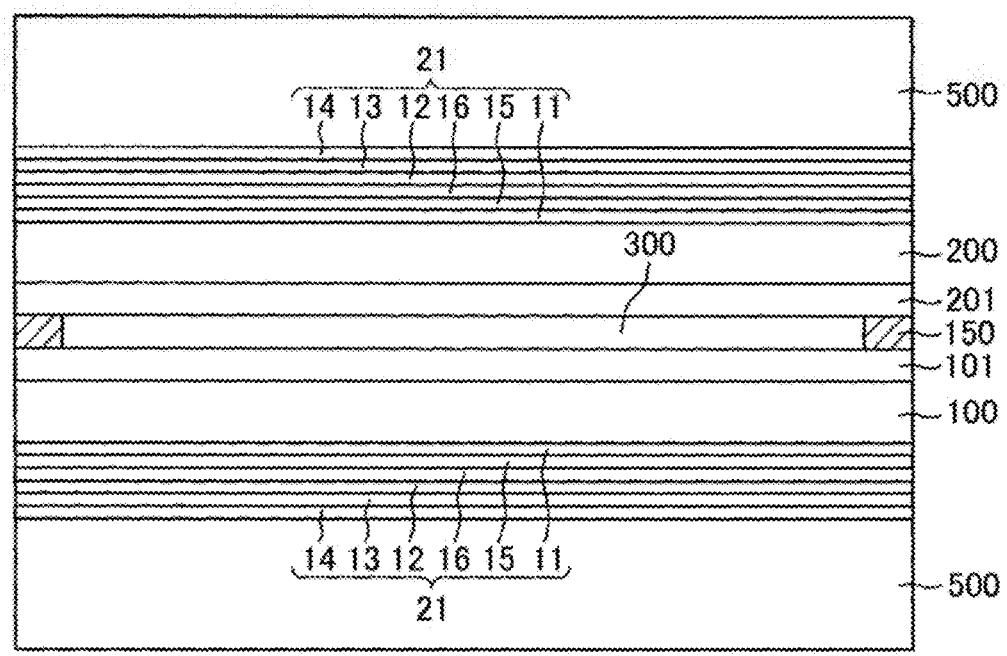
FIG. 30 is a cross sectional view of the liquid crystal display panel before the glass substrate is eliminated according to embodiment 4.

Such a liquid crystal display panel is manufactured as follows. As depicted in FIG. 30, the TFT substrate 100 is formed on the glass substrate 500, and the counter substrate 200 is formed on the glass substrate 500; the liquid crystal 300 is filled between the TFT substrate 100 and the counter substrate 200. The TFT substrate 100 and the counter substrate 200 are adhered by the sealant 150 and the liquid crystal 300 is sealed by the sealant 150.

In this state, the multilayer film 21 exists between the TFT substrate 100 and the glass substrate 500, and between the counter substrate 200 and the glass substrate 500. The multilayer film 21 comprises: the adhesive layer 11, the SiO layer 15, which constitutes a barrier layer, the AlO layer 16, which constitutes a barrier layer, and non-thermal expansion layer 12, the thermal expansion layer 13 and the photo heat conversion layer 14. The structure and the function of each layers are the same as explained in embodiment 2.

Figure 31:
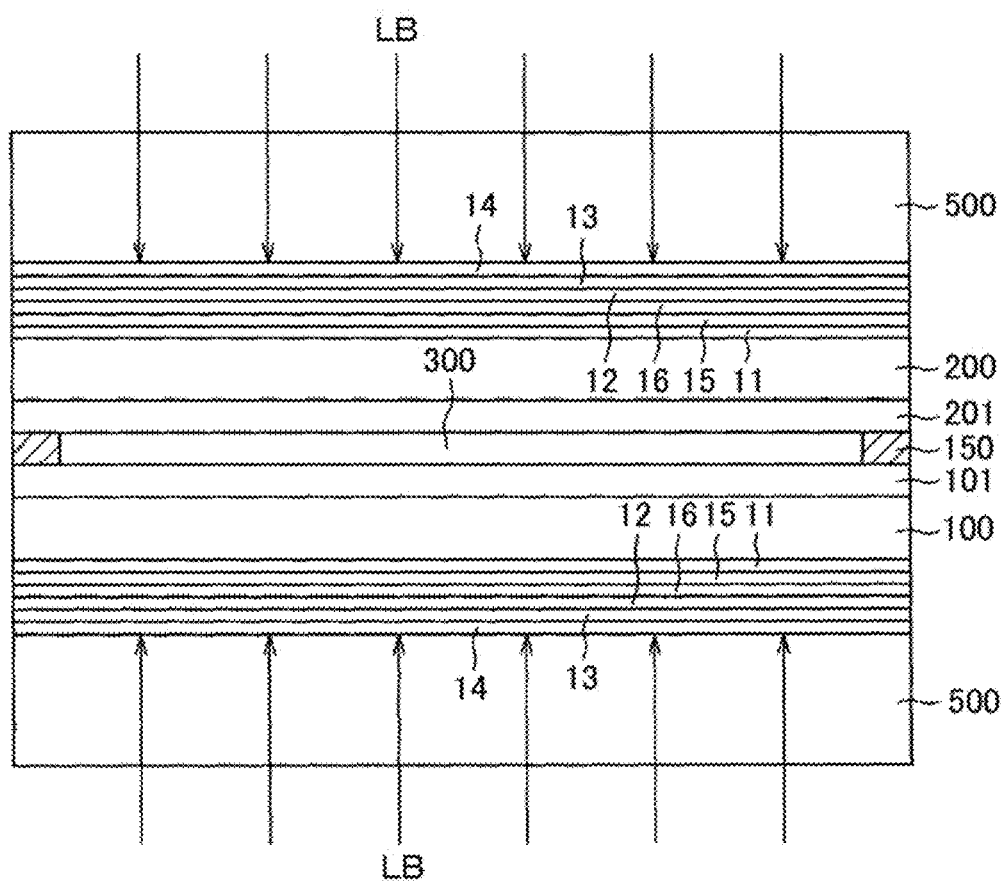
FIG. 31 is a cross sectional view that the laser beam is irradiated to separate the glass substrate from the liquid crystal display panel according to embodiment 4.

After that, as depicted in FIG. 31, the laser beam (LB) is irradiated to the photo heat conversion layer 14 to make the heat expansion layer 13 expand sharply, and subsequently, make the heat expansion layer 13 shrink sharply after the termination of the irradiation of the laser beam, to separate the thermal expansion layer 13 and the non-thermal expansion layer 12 by the stress; consequently, to separate the TFT substrate 100 and the counter substrate 200. The condition of the laser beam irradiation and the mechanism of peeling of those layers are the same as explained in embodiment 1.

Back to FIG. 29, a difference between the liquid crystal display device and the organic EL display device is that the liquid crystal display device uses a back light. Among the multilayer film, the adhesive layer 11 and the thermal expansion layer 12 are the same as explained in embodiment 3. In addition to that, in FIG. 29, the SiO layer 15 as a barrier layer and the AlO layer 16 as a barrier layer are formed. The SiO layer 15 has no influence to a transmittance of visible light as explained in FIG. 26. Further, the transmittance of the AlO layer 16 for the visible light is approximately 90% even including the reflection at the interface; thus, influence of the AlO layer 16 to the transparency can be neglected. As described above, as far as the transmittance of the material for the adhesive layer 11 is taken care of, the present invention can be applied to the liquid crystal display device of embodiment 4 as well as to the liquid crystal display device of embodiment 3.

FIG. 32 is a table summarizing thermal characteristics of the material relating to this specification. In FIG. 32, a combination of Al, used as the material for the heat expansion layer 13, and SiO, used as the non-thermal expansion layer 12, has an excellent effect in the present invention, In embodiments 1-4, the a-Si is used for the photo heat conversion layer 14; however, as described in FIG. 11, poly-Si also absorbs 100% of the ultra violet laser of wave length of 308 nm and 355 nm. Therefore, the poly-Si film can be used as the photo heat conversion layer 14.

The materials of Al, Cr, and Ti are listed for the adhesive layer 11; however, the aluminum oxide (AlO), which is metal oxide, can be used to raise adhesive strength. Namely, as depicted in FIG. 10, if AlOOH exists in the adhesive layer 11, the OH group of AlOOH connects with the amide group and the carboxyl group in the polyimide by dehydration reaction; thus, strong bonding can be attained between the polyimide and the AlO layer 11.

In addition, since AlO is transparent to visible light, it has a great merit when the present invention is applied to the liquid crystal display device. Namely, if AlO is used, a liberty in designing a thickness of the adhesive layer 11 can be increased in the liquid crystal display device. Further, the transparent conductive film ITO has OH group at the surface, and it is transparent to visible light; thus ITO also can be used for the adhesive layer 11 as well as AlO.

What is claimed is:

1. A display device having pixels on a resin substrate comprising:
    a first layer made of a metal and formed on and in contact with the resin substrate, the resin substrate being between the first layer and the pixels;
    a second layer made of a first insulating material and in contact with the first layer, the first layer being between the resin substrate and the second layer;
    a third layer made of a second insulating material and in contact with the second layer, the second layer being between the first layer and the third layer; and
    a fourth layer made of a third insulating material and in contact with the third layer, the third layer being between the second layer and the fourth layer.

2. The display device according to claim 1,
wherein the resin substrate is made of polyimide.

3. The display device according to claim 1,
wherein the first layer is made of Al.

4. The display device according to claim 3,
wherein a thickness of the first layer is 10 nm or less.

5. The display device according to claim 1,
wherein the second layer is made of silicon oxide.

6. The display device according to claim 1,
wherein a thickness of the second layer is 50 to 200 nm.

7. The display device according to claim 1,
wherein the second layer is thicker than the first layer.

8. The display device according to claim 1,
wherein the third layer is made of aluminum oxide and the fourth layer is made of silicon oxide.

9. The display device according to claim 8,
wherein the first layer is thinner than the fourth layer.

10. The display device according to claim 3,
wherein a thickness of the Al is 50 nm or less.

11. The display device according to claim 3,
wherein a thickness of the Al is 5 to 10 nm.

* * * * *